United States Patent [19]

Powell

[11] Patent Number: 5,324,998
[45] Date of Patent: Jun. 28, 1994

[54] ZERO POWER REPROGRAMMABLE FLASH CELL FOR A PROGRAMMABLE LOGIC DEVICE

[75] Inventor: Stanley J. Powell, Boise, Id.

[73] Assignee: Micron Semiconductor, Inc., Boise, Id.

[21] Appl. No.: 15,761

[22] Filed: Feb. 10, 1993

[51] Int. Cl.$^5$ .............................. H03K 19/173
[52] U.S. Cl. ................... 307/465; 365/185; 307/468
[58] Field of Search ............. 307/465, 468–469; 365/900, 185

[56] References Cited

U.S. PATENT DOCUMENTS

| | | | |
|---|---|---|---|
| 3,423,646 | 1/1969 | Cubert et al. | 317/234 |
| 3,566,153 | 2/1971 | Spencer, Jr. | 307/205 |
| 4,124,899 | 11/1978 | Burkener et al. | 364/716 |
| 4,717,912 | 1/1988 | Harvey et al. | 340/825.83 |
| 4,758,746 | 7/1988 | Berkner et al. | 307/465 |
| 4,763,020 | 8/1988 | Takata | 307/465 |
| 4,787,047 | 11/1988 | Wei | 307/465 |
| 4,873,459 | 10/1989 | El Gamel | 307/465 |
| 4,935,648 | 6/1990 | Radjy | 307/465 |
| 4,949,309 | 8/1990 | Rao | 307/465 |
| 4,963,769 | 10/1990 | Hiltpold et al. | 307/465 |
| 5,138,576 | 8/1992 | Madurawe | 365/185 |
| 5,220,533 | 6/1993 | Turner | 365/185 |
| 5,241,507 | 8/1993 | Fong | 365/185 |

*Primary Examiner*—David R. Hudspeth
*Assistant Examiner*—Andrew Sanders
*Attorney, Agent, or Firm*—Michael W. Starkweather

[57] ABSTRACT

There is a zero power reprogrammable flash cell for a programmable logic device. Specifically, there is a PLD capable of "zero power" during the standby period, being capable of functioning within around a 10 nanosecond time frame, and having programmable OR arrays. Uniquely, the subject invention is capable of using only microamps of power during standby periods. The use of a flash transistor enables reprogrammability of the PLD.

9 Claims, 2 Drawing Sheets

| MODE | POC | CEN | DIGIT LINE | CB | AS$_n$ |
|---|---|---|---|---|---|
| PROGRAM | V$_{CC}$ | V$_{SS}$ | 7-8 V | 12 V | V$_{SS}$ |
| PRGM_VFY | V$_{CC}$ | V$_{SS}$ | 2-3 V | V$_{CC}$ | V$_{SS}$ |
| ERASE | V$_{CC}$ | V$_{SS}$ | V$_{SS}$ | V$_{SS}$ | 12 V |
| POWER UP | V$_{SS}$ | 2.5 | V$_{SS}$ | V$_{CC}$ | V$_{SS}$ |
| NORMAL | V$_{CC}$ | 2.5 | V$_{SS}$ | V$_{CC}$ | V$_{SS}$ |

FIG. 2

ZERO POWER REPROGRAMMABLE FLASH CELL FOR A PROGRAMMABLE LOGIC DEVICE

CROSS-REFERENCES TO RELATED OR COPENDING APPLICATIONS

U.S. patent application Ser. No. 07/865,007, filed Apr. 8, 1992, is a field programmable logic array with speed optimized architecture, having common assignee with the present invention.

U.S. patent application Ser. No. 07/817,167, filed Jan. 6, 1992, is a CMOS logic cell for high-speed, zero-power programmable array logic devices, having common assignee with the present invention.

U.S. patent application Ser. No. 07/865,007, filed Apr. 8, 1992, is a field programmable logic array with speed optimized architecture, having common assignee with the present invention.

U.S. patent application Ser. 07/883,759, filed May 15, 1992, is a programmable logic device with a single parameter state decode, having common assignee with the present invention.

U.S. patent application Ser. No. 07/884,489, filed May 15, 1992, is a programmable logic device macrocell with two or array inputs, having common assignee with the present invention.

U.S. patent application Ser. No. 883,076, filed May 15, 1992, is a programmable logic device macrocell with an exclusive feedback line and an exclusive external input line, having common assignee with the present invention.

U.S. patent application Ser. No. 07/884,505, filed May 15, 1992, is a programmable logic device macrocell with an exclusive feedback line and an exclusive external input line for a combinatorial mode and accommodating two separate programmable or planes, having common assignee with the present invention.

U.S. patent application Ser. No. 07/883,843, filed May 15, 1992, is a programmable logic device macrocell with an exclusive feedback line and an exclusive external input line for a state counter or registered sum-of-products signal, having common assignee with the present invention.

U.S. patent application Ser. No. 07/883,078, filed May 15, 1992, is a programmable logic device macrocell with an exclusive feedback line and an exclusive external input line for registered and combinatorial modes using a dedicated product term for control, having common assignee with the present invention.

U.S. patent application Ser. No. 07/914,361, filed Jul. 15, 1992, is a field programmable logic array with a dual or plane macro-cell architecture.

FIELD OF THE INVENTION

The present invention relates to integrated circuits (ICs) architecture. Particularly, there is a Programmable Logic Device, PLD for short, that uses a reprogrammable flash cell architecture. Uniquely, the flash architecture of this invention enables user control of the inputs to the AND and OR arrays, and the output macrocell configurations of the IC.

BACKGROUND OF THE INVENTION

Historically

The introduction of programmable logic devices (PLD) was a true revolution in the hardware design world. It enabled engineers to shrink circuits requiring several devices onto a single device thus simplifying their designs while saving space and power. Traditionally, PLDs have been used in combinational circuits such as address decoders as well as sequential circuits such as bus arbitration schemes. During the last few years, advances and improvements in PLD architectures enabled the devices to grow more complex while addressing the never-ending quest for higher density and faster speeds. Despite these improvements, engineers still face certain problems and limitations with PLDs.

A typical programmable logic device is composed of a user-programmable AND array, a fixed OR gate, followed by an output register which includes a feedback path from the output to the programmable AND array. PLDs also have circuitry for programming the inputs to the AND and OR arrays, and for configuring the output macrocells.

PROBLEMS

Most PLD architectures have several problems related to the standby current. Standby current is the current required by the chip existing between successive inputs to the chip. In other words, its the current needed to keep the chip ready for action. Typical PLDs use huge amounts of current during the standby mode, ranging around the hundreds of milliamps. This amount of current is an excessive waste when considering the limited life of most batteries used in portable computers.

Additionally, other PLDs have gone to the extreme of powering down the chip during standby periods. However, though the chip will not use current during the standby period, it will take 20 to 30 nanoseconds to power up the chip again. This situation creates a huge timing problem, considering that most chips need to be ready within around 10 nanoseconds.

Similarly, most PLDs are not capable of programming the logical OR arrays. This greatly limits the applications for a PLD.

Additionally, most PLDs use sense amps for programming the ones and zeros to the inputs and other locations on the PLD during normal operation. This has the effect of using a substantial amount of power during standby periods. Today's battery powered computers are severely limited with this type of power usage.

Therefore, a need exists for PLD capable of "zero power" during the standby period, functioning within a 10 nanosecond time frame, and having programmable OR arrays.

It is noted that the above described problems, as well as other problems, are solved through the subject invention and will become more apparent, to one skilled in the art, from the detailed description of the subject invention.

SUMMARY OF THE INVENTION

One skilled in the art will appreciate the advantage of the subject zero power reprogrammable flash cell programmable logic device. Specifically, there is a PLD capable of "zero power" during the standby period, begin functioning within around a 10 nanosecond time frame, and having programmable OR arrays. Uniquely, the subject invention is capable of using only microamps of power during standby periods.

The subject PLD circuit contains a sense amp that is used strictly for program verification operations, normally a very short period of time, and not during standby periods. There are also a plurality of programmable cells connected to the sense amp. Each programmable cell has a half latch circuit, wherein the output from the half latch circuit is used to program various portions of the programmable logic device. A second portion of the programmable cell has a split gate flash cell circuit, coupled to the half latch circuit, for determining it the output of the half latch circuit is a high or low signal.

The half latch circuit is further made of a power rail, a first and second P-channel transistor, each having the source electrically coupled to the power rail, and the drains coupled together. There is also an inverter having inputs from the drains of the first and second P-channel transistors, and having the output electrically coupled to the gate of the second P-channel transistor, the output of the inverter is the output of the half latch circuit for setting the state of various portions of the programmable logic device. Additionally, there is a first N-channel transistor having its drain electrically coupled to the drains of the first and second P-channel transistors.

The split gate flash cell circuit further encompasses a second N-channel transistor having the drain electrically coupled to the source of the first N-channel transistor. There is also a flash transistor having the source coupled to a grounding circuit, the drain electrically coupled to the source of the second N-channel transistor, and the gate coupled to the gate of the second N-channel transistor.

The subject PLD circuit further having a gating transistor having its drain electrically coupled to a digit line which is coupled to a sense amp, and the source connected to the source of the first N-channel transistor and to the drain of the second N-channel transistor.

Other features and objects of the present invention will become more clear from the following detailed description of the invention, taken in conjunction with the accompanying drawings and claims, or may be learned by the practice of the invention.

BRIEF DESCRIPTION OF THE DRAWINGS

FIG. 2 is a timing chart for the invention.

Figure 1:
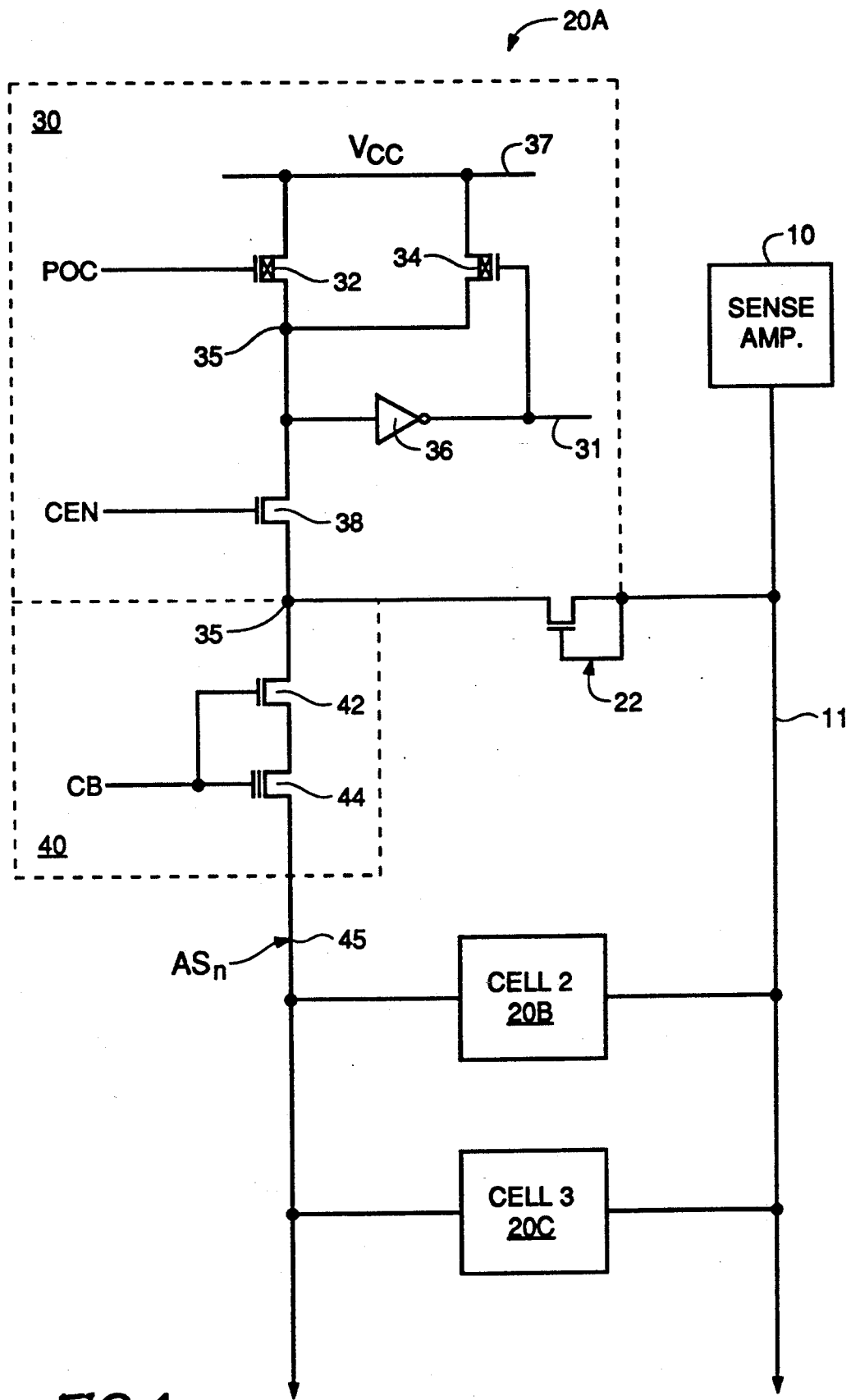
FIG. 1 is a detailed illustration of the invention.

It is noted that the drawings of the invention are not to scale. The drawings are merely schematic representations, not intended to portray specific parameters of the invention. The drawings are intended to depict only typical embodiments of the invention, and are therefore not to be considered limiting of its scope. The invention will be described with additional specificity and detail through the use of the accompanying drawings. Additionally, like numbering in the drawings represent like elements within and between drawings.

DETAILED DESCRIPTION OF THE ILLUSTRATED EMBODIMENT

This disclosure of the invention is submitted in furtherance of the constitutional purposes of the U.S. Patent Laws "to promote the progress of science and useful arts" (Article 1, Section 8 of the U.S. Constitution).

INCORPORATED MATERIAL

For the purpose of providing background material which may in some respects illustrate the state of the art, the following books (or articles or pamphlets) are herein incorporated by reference: "Programmable Logic Handbook," fourth edition, by Monolithic Memories Inc., 2175 Mission College Blvd., Santa Clara, Calif.; "Practical Design Using Programmable Logic," by D. Pellerin and M. Holley, Prentice Hall, library of Congress no. TK7872 .L64 P44 1991; and Flash Memory Products", by Advanced Micro Devices, 1992/1993 data book handbook.

The following U.S. patents are herein incorporated by reference for pertinent and supporting information:

U.S. Pat. No. 3,423,646, is a computer logic device consisting of an array of tunneling diodes, isolators and short circuits.

U.S. Pat. No. 3,566,153, is a programmable sequential logic device.

U.S. Pat. No. 4,124,899, is a programmable array logic circuit.

U.S. Pat. No. 4,717,912, an apparatus for producing any one of a plurality of signals at a single output.

U.S. Pat. No. 4,758,746, is a programmable logic array with added array of gates and added output routing flexibility.

U.S. Pat. No. 4,763,020, is a programmable logic device having plural programmable function cells.

GENERAL EMBODIMENT

FIG. 1 is a detailed illustration of the invention and includes the following elements: There is a sense amp 10 connected to programmable cells 20 a, b, and c via a digit line 11. The cells are each divided into two portions, a half latch circuit 30, and split gate flash cell circuit 40. There is a power rail Vcc 37. P-channel transistors are 32, and 34, while N-channel transistors are 22, 38, and 42. There is a flash transistor 44 having the source coupled to array source (AS). There are three input signals, power on control (POC), cell enable (CEN), and cell bias (CB). There is an inverter 36. There are nodes 31, 33, and 35.

OPERATION OF THE INVENTION

One skilled in the art should easily understand the operation of the invention in reference to FIG. 2 illustrating the timing of the invention. To program the flash cell 44, CB is brought up to 12 volts, the drain to 8 volts via digit line 11, and the source to zero volts via ASn 45.

To verify the programming of cell 44, digit line 11 is brought to about 3 volts, CB is 5 volts (Vcc), and if the flash cell was properly programmed current will not flow via to ASn 45 across flash 44. Thus, the sense amp will sense a lack of current flow and verify the programming. Of course transistor 38 is off during the programming and verifying of the programming.

To erase the programming of the flash cell, ASn 45 is brought to 12 volts, the gate has zero volts, and the drain will float, thus removing all charge from the cell 44.

During power up of the chip, there are two scenarios for this circuit. In the first instance, POC is at first brought low, turning on transistor 32, and pulling node 35 high. If the flash cell 44 was not programmed, node 35 will be pulled low through transistors 38, 42, and 44 to ASn 45 which acts as a ground. As a result, node 31 is pulled high, keeping transistor 34 off. Thereby, POC will be brought back to high. Consequently, node 31 will remain low during the operation of the chip.

In the second instance, if the flash cell is programmed, node 35 will stay high, since no current can flow past the flash cell, node 31 is brought low, thus turning transistor 34 on. With this arrangement, node 35 will remain high during the operation of the chip. POC will again be brought high and turning off transistor 32.

REMARKS ABOUT THE INVENTION

It is noted that node 31 can be used to control various parts of the PLD. For example, the inputs to the AND and OR arrays, and the macrocell configurations can be controlled. The important feature from this architecture is that the PLD is now capable of being reprogrammed for another use by the user. This saves money in not having to repurchase more PLDs every time the logic pattern needs to be changed.

One skilled in the art will also recognize that since the sense amp is used only for programming verification, and not used during standby operations, no power is used by the sense amps.

It is further noted that, there is low power consumption by this type of architecture. In particular, by maintaining POC high, there is no draining of the current from Vcc 37 to node 45. Therefore, a static logic level is maintained at the output 31 of the circuit. This zero power usage is not available in other PLD packages.

VARIATIONS IN THE INVENTION

There are several obvious variations to the broad invention and thus come within the scope of the present invention. Uniquely, this invention may work with any combination of signal inputs. Specifically, POC could be used for both POC and CEN signals. Additionally, there could be an additional signal for transistor 42 instead of using signal CB exclusively.

While the invention has been taught with specific reference to these embodiments, someone skilled in the art will recognize that changes can be made in form and detail without departing from the spirit and the scope of the invention. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

Although subheadings in the Detailed Description of the Illustrated Embodiment are used, these are merely provided for assisting the reader; wherein, the writer is free to enter any information under any heading/s.

What is claimed and desired to be secured by United States patent is:

1. A programmable logic device, comprising:
   a sense amp (10);
   a plurality of programmable cells (20 a, b, and c) connected to the sense amp, each having:
   a) a half latch circuit (30), wherein an output (31) from the half latch circuit is used to program various portions of the programmable logic device; and
   b) a split gate flash cell circuit (40), coupled to the half latch circuit, for determining if the output of the half latch circuit is a high or low signal.

2. The programmable logic device of claim 1, wherein said half latch circuit comprises:
   a power rail;
   a first and second P-channel transistor, each having the source electrically coupled to the power rail, and the drains coupled together;
   an inverter having inputs from the drains of the first and second P-channel transistors, and having the output electrically coupled to the gate of the second P-channel transistor, the output of the inverter is the output of the half latch circuit for setting a state for various portions of the programmable logic device; and
   a first N-channel transistor (38) having its source electrically coupled to the drains of the first and second P-channel transistors.

3. The programmable logic device of claim 2, wherein said split gate flash cell circuit comprises:
   a second N-channel transistor (42) having the drain electrically coupled to the source of the first N-channel transistor; and
   a flash transistor (44) having:
   a) the source coupled to a grounding circuit (AS 45),
   b) the drain electrically coupled to the source of the second N-channel transistor, and the gate coupled to the gate of the second N-channel transistor.

4. The programmable logic device of claim 3, further comprising:
   a gating transistor having its drain electrically coupled to the sense amp, and the source connected to the source of the first N-channel transistor and to the drain of the second N-channel transistor.

5. A PLD programming circuit, comprising:
   a first node;
   flash circuit means coupled to the first node having a first state for pulling the voltage of the first node down, and a second state for maintaining the voltage on the first node; and
   latching circuit means, coupled to the first node, having a first mode for outputting a high signal when the first node is low, and a second mode for outputting a low signal when the first node is high.

6. The PLD of claim 5, wherein the flash circuit means comprises:
   a flash transistor that enables the first state when the flash transistor is programmed, thus allowing current to flow to ground, and enables the second state when the flash transistor is programmed to not conduct current to the ground.

7. The PLD of claim 6, further comprising:
   a verify circuit means, coupled to the first node, for verifying if the first node is pulled low after the flash transistor is unprogrammed for the first state, and for verifying if the first node will remain high after the flash transistor is programmed for the second state.

8. A circuit, comprising:
   a programmable logic device having:
   means for programming a flash memory cell; and
   a sense amp that is used exclusively for verification of the programming means.

9. A PLD having programmable AND and OR arrays, comprising:
   a flash memory cell used to determine the inputs to the AND and OR arrays of the PLD;
   means for programming the flash memory; and
   the PLD consuming only microamps of power during standby periods.

* * * * *